United States Patent
Gossman et al.

(10) Patent No.: US 8,143,515 B2
(45) Date of Patent: Mar. 27, 2012

(54) CADMIUM TELLURIDE THIN FILM PHOTOVOLTAIC DEVICES AND METHODS OF MANUFACTURING THE SAME

(75) Inventors: Robert Dwayne Gossman, Aurora, CO (US); Jennifer A. Drayton, Golden, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 232 days.

(21) Appl. No.: 12/638,749

(22) Filed: Dec. 15, 2009

(65) Prior Publication Data

US 2011/0139235 A1 Jun. 16, 2011

(51) Int. Cl.
*H01L 31/00* (2006.01)
*H01L 21/00* (2006.01)

(52) U.S. Cl. ............... 136/256; 136/260; 438/84
(58) Field of Classification Search ............ 136/256, 136/260; 438/84
See application file for complete search history.

(56) References Cited

U.S. PATENT DOCUMENTS

| | | | |
|---|---|---|---|
| 5,261,968 A | 11/1993 | Jordan | |
| 5,922,142 A | 7/1999 | Wu et al. | |
| 6,137,048 A | 10/2000 | Wu et al. | |
| 6,169,246 B1 | 1/2001 | Wu et al. | |
| 6,221,495 B1 | 4/2001 | Wu et al. | |
| 6,444,043 B1 | 9/2002 | Gegenwart et al. | |
| 6,579,427 B1 | 6/2003 | Arbab et al. | |
| 6,913,943 B2 | 7/2005 | Cunningham et al. | |
| 2005/0224111 A1 | 10/2005 | Cunningham et al. | |
| 2008/0096376 A1 | 4/2008 | Li et al. | |
| 2008/0182358 A1 | 7/2008 | Cowdery-Corvan et al. | |
| 2008/0308151 A1 | 12/2008 | Den Boer et al. | |
| 2009/0081826 A1 | 3/2009 | Cowdery-Corvan et al. | |
| 2009/0084438 A1 | 4/2009 | Den Boer et al. | |
| 2009/0127101 A1 | 5/2009 | Nauman et al. | |
| 2009/0194165 A1 | 8/2009 | Murphy et al. | |
| 2010/0019239 A1 | 1/2010 | Cheong et al. | |
| 2010/0032008 A1 | 2/2010 | Adekore | |

OTHER PUBLICATIONS

Vijayalashmi et al., "Physical properties of zinc doped tin oxide films prepared by spray pyrolysis technique", J. Phys. D: Appl Phys. 41, Jan. 2008.*

Minami et al., "Highly transparent and conductive zinc-stannate thin films prepared by RF Magnetron Sputtering", Jpn. J. Appl. Phys. 33, 1994, p. 1693-1696.*

* cited by examiner

*Primary Examiner* — Basia Ridley
*Assistant Examiner* — Allison Bourke
(74) *Attorney, Agent, or Firm* — Dority & Manning, P.A.

(57) ABSTRACT

Methods for manufacturing a cadmium telluride based thin film photovoltaic device are generally disclosed. The method can include sputtering a resistive transparent layer on a transparent conductive oxide layer from an alloy target including zinc from about 5% by weight and about 33% by weight and tin. The method can also include forming a cadmium sulfide layer on the resistive transparent layer, forming a cadmium telluride layer on the cadmium sulfide layer, and forming a back contact layer on the cadmium telluride layer. Cadmium telluride thin film photovoltaic devices are also generally disclosed including a resistive transparent layer having a mixture of zinc oxide and tin oxide having a zinc oxide concentration between about 5% and about 33% by mole fraction.

19 Claims, 3 Drawing Sheets

CADMIUM TELLURIDE THIN FILM PHOTOVOLTAIC DEVICES AND METHODS OF MANUFACTURING THE SAME

FIELD OF THE INVENTION

The subject matter disclosed herein relates generally to cadmium telluride thin film photovoltaic devices and methods of their manufacture. More particularly, the subject matter disclosed herein relates to cadmium telluride thin film photovoltaic devices having a resistive transparent layer formed from a mixture of zinc oxide and tin oxide.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., a positive, electron accepting layer) and the CdS layer acts as a n-type layer (i.e., a negative, electron donating layer). Free carrier pairs are created by light energy and then separated by the p-n heterojunction to produce an electrical current.

Reducing the thickness of the layers between the window glass and the cadmium telluride layer (e.g., the transparent conductive layer, the cadmium sulfide layer and any buffer layer(s) therebetween) can reduce the amount of absorption of radiation energy (e.g., solar energy) by the device prior to the energy reacting the cadmium telluride layer. Thus, the overall conversion efficiency of the device may be improved. Additionally, reducing the thickness of the cadmium sulfide layer can allow for more of the shorter wavelength (e.g., blue radiation) to reach the cadmium telluride layer, again improving the overall conversion efficiency of the device.

However, reducing the thickness of the cadmium sulfide layers, along with any other layers between the glass and the cadmium telluride layer, can create other problems that are potentially detrimental to the performance of the device. For example, a relatively thin cadmium sulfide layer can lead to interface defects such as pinholes that create localized junctions between the transparent conductive oxide layer and the cadmium telluride layer. Such defects can lower the open circuit voltage ($V_{oc}$) of the device and reduce the fill factor of the device.

Thus, a need exists for cadmium telluride photovoltaic devices having improved energy conversion efficiency and/or device lifetime through reduced thicknesses of the layers between the window glass and the cadmium telluride layer, while reducing the side-effects typically associated with reduced thicknesses of those layers.

BRIEF DESCRIPTION OF THE INVENTION

Aspects and advantages of the invention will be set forth in part in the following description, or may be obvious from the description, or may be learned through practice of the invention.

Methods for manufacturing a cadmium telluride based thin film photovoltaic device are generally disclosed. The method can include sputtering a resistive transparent layer on a transparent conductive oxide layer from an alloy target including zinc from about 3% by weight and about 22% by weight and tin. The method can also include forming a cadmium sulfide layer on the resistive transparent layer, forming a cadmium telluride layer on the cadmium sulfide layer, and forming a back contact layer on the cadmium telluride layer.

Cadmium telluride thin film photovoltaic devices are also generally disclosed. These devices can include a glass superstrate, a transparent conductive oxide layer on the glass superstrate, a resistive transparent layer on the transparent conductive oxide layer, a cadmium sulfide layer on the resistive transparent layer, a cadmium telluride layer on the cadmium sulfide layer, and a back contact on the cadmium telluride layer. The resistive transparent layer can include a mixture of zinc oxide and tin oxide having a zinc oxide concentration between about 5% and about 33% by mole fraction.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, directed to one of ordinary skill in the art, is set forth in the specification, which makes reference to the appended figures, in which.

Figure 1:
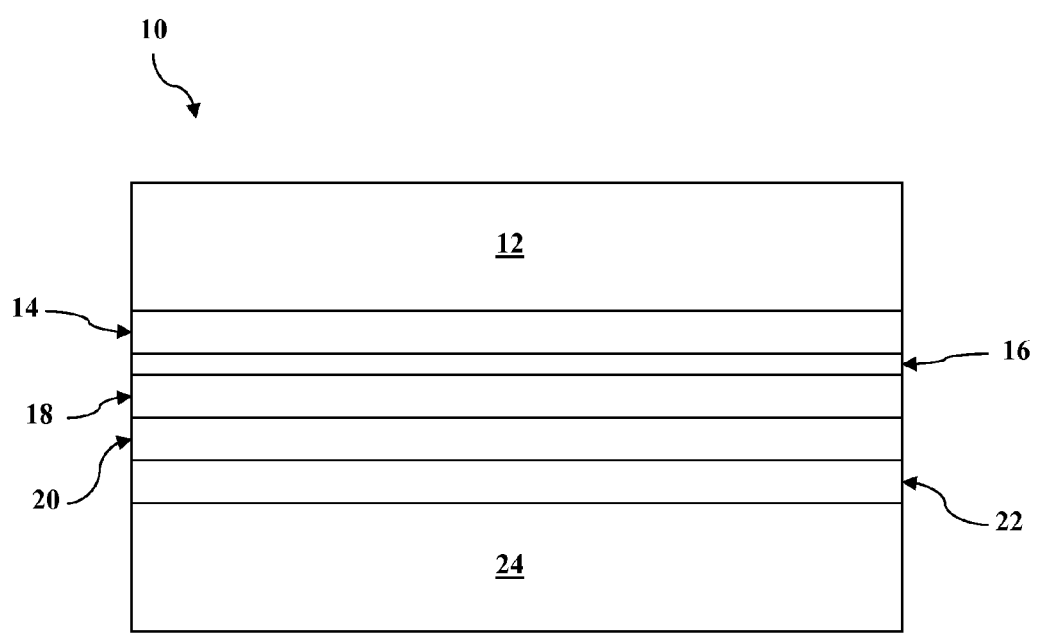
FIG. 1 shows a general schematic of a cross-sectional view of an exemplary cadmium telluride thin film photovoltaic device according to one embodiment of the present invention.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Generally speaking, a cadmium telluride thin film photovoltaic device is presently disclosed having a resistive transparent layer formed from a mixture of zinc oxide and tin oxide, along with methods of its manufacture. The resistive transparent layer is generally positioned between a transparent conductive oxide (TCO) layer and a cadmium sulfide layer in the cadmium telluride thin film photovoltaic device, and allows for a relatively thin cadmium sulfide layer to be included in the device by reducing the possibility of interface defects (i.e., "pinholes" in the cadmium sulfide layer) creating shunts between the TCO layer and the cadmium telluride layer. Thus, without wishing to be bound by any particular theory, it is believed that the resistive transparent layer allows for improved adhesion and/or interaction between the TCO layer and the cadmium telluride layer, thereby allowing a relatively thin cadmium sulfide layer to be formed thereon without significant adverse effects that would otherwise result from such a relatively thin cadmium sulfide layer formed directly on the TCO layer. Additionally, the resistive transparent layer is generally more resistive than the TCO layer and can help protect the device from chemical interactions between the TCO layer and the subsequent layers during processing of the device. For example, in certain embodiments, the resistive transparent layer can have a sheet resistance that is greater than about 1000 ohms per square, such as from about 10 kOhms per square to about 1000 MOhms per square.

The resistive transparent layer includes a combination of zinc oxide (ZnO) and tin oxide ($SnO_2$) to form a non-stoichiometric variation of zinc stannate, which is normally $Zn_2SnO_4$. Specifically, according to the present application a decreased amount of zinc is included, when compared to the normal stoichiometric zinc stannate, to provide a shortage of zinc in the resistive transparent layer compared to an excess amount of tin in the resistive transparent layer. Thus, the resistive transparent layer can be expressed as $Zn_xSn_{1-x}O_{2-x}$, where $0.05 > x > 0.33$, such as $0.1 \geq x \geq 0.2$.

This particular mixture of tin oxide and zinc oxide can lead to a resistive transparent layer having suitable transparency, resistivity, and stability for use between the TCO layer and the cadmium sulfide layer. The resistive transparent layer can also have a wide optical bandgap (e.g., greater than about 2.5 eV, such as from about 2.7 eV to about 3.0 eV). Additionally, this particular mixture of tin oxide and zinc oxide can lead to a resistive transparent layer configured to withstand subsequent heating and cooling for deposition of additional layers (e.g., a cadmium sulfide layer, a cadmium telluride layer) and/or annealing processes to which the device may be subjected during further processing.

The resistive transparent layer can be formed by sputtering, chemical vapor deposition, spray pyrolysis, or any other suitable deposition method. In one particular embodiment, the resistive transparent layer can be formed by sputtering (e.g., DC sputtering or RF sputtering) on the TCO layer.

Sputtering deposition involves ejecting material from a target, which is the material source, and depositing the ejected material onto the substrate to form the film. DC sputtering generally involves applying a direct current to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. The pressure can be even higher for diode sputtering (e.g., from about 25 mTorr to about 100 mTorr). When metal atoms are released from the target upon application of the voltage, the metal atoms deposit onto the surface of the substrate. For example, when the atmosphere contains oxygen, the metal atoms released from the metal target can form a metallic oxide layer on the substrate. The current applied to the source material can vary depending on the size of the source material, size of the sputtering chamber, amount of surface area of substrate, and other variables. In some embodiments, the current applied can be from about 2 amps to about 20 amps.

Conversely, RF sputtering involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr for magnetron sputtering. Again, the pressure can be even higher for diode sputtering (e.g., from about 25 mTorr to about 100 mTorr).

For example, the resistive transparent layer can be deposited using a DC sputtering method by applying a DC current to a metallic source material including a mixture of elemental zinc and elemental tin with a zinc concentration between about 3% by weight and about 22% by weight, such as from about 5% by weight to about 20% by weight, or particularly from about 10% by weight and about 20% by weight. In particular embodiments, the metallic source material can consist essentially of elemental zinc and elemental tin (e.g., being substantially free from all other metals) and can have a zinc concentration between about 3% by weight and about 22% by weight, such as from about 5% by weight to about 20% by weight, or particularly from about 10% by weight and about 20% by weight, with the remaining weight percentage being elemental tin (i.e., from about 78% to about 97% by weight, such as from about 80% to about 95% by weight, or particularly from about 80% to about 90% by weight). The metallic source material can be sputtered onto the TCO layer in the presence of an oxidizing atmosphere (e.g., $O_2$ gas) having a pressure between about 1 mTorr and about 20 mTorr at a temperature between about 15° C. and about 300° C. In one particular embodiment, sputtering can be carried out at room temperature (e.g., from about 20° C. to about 25° C.). When the oxidizing atmosphere includes oxygen gas (i.e., $O_2$), the atmosphere can be greater than about 95% pure oxygen, such as greater than about 99%.

In an alternative embodiment, the resistive transparent layer can be deposited using a RF sputtering method by applying a radio frequency (or alternating current) to a ceramic source material including a mixture of zinc oxide and tin oxide with a zinc oxide concentration between about 5% by mole fraction and about 33% by mole fraction, such as from about 5% by mole fraction to about 20% by mole fraction, or particularly from about 10% by mole fraction and about 20% by mole fraction. In particular embodiments, the ceramic source material can consist essentially of zinc oxide and tin oxide (e.g., being substantially free from all other metallic oxides) and can have a zinc oxide concentration between about 5% by mole fraction and about 33% by mole fraction, such as from about 5% by mole fraction to about 20% by mole fraction, or particularly from about 10% by mole fraction and about 20% by mole fraction, with the remaining weight percentage being tin oxide (i.e., from about 67% to about 95% by mole fraction, such as from about 80% to about 95% by mole fraction, or particularly from about 80% to about 90% by mole fraction). The ceramic source material can be sputtered onto the TCO layer in the presence of an inert atmosphere (e.g., argon gas) having a pressure between about 1 mTorr and about 20 mTorr at a temperature between about 15° C. and about 300° C. In one particular embodiment, sputtering can be carried out at room temperature (e.g., from about 20° C. to about 25° C.).

No matter the method of forming the layer, the resistive transparent layer can have a thickness between about 0.075 µm and about 1 µm, for example from about 0.1 µm to about 0.5 µm. In particular embodiments, the resistive transparent layer can have a thickness between about 0.08 µm and about 0.2 µm, for example from about 0.1 µm to about 0.15 µm.

The resistive transparent layer formed from the mixture of zinc oxide and tin oxide can be included in any cadmium telluride device that utilizes a cadmium telluride layer, such as in the cadmium telluride thin film photovoltaic device disclosed in U.S. Publication No. 2009/0194165 of Murphy, et al. titled "Ultra-high Current Density Cadmium Telluride Photovoltaic Modules."

FIG. 1 represents an exemplary cadmium telluride thin film photovoltaic device 10. The exemplary device 10 of FIG. 1 includes a top sheet of glass 12 employed as the substrate. In this embodiment, the glass 12 can be referred to as a "superstrate", as it is the substrate on which the subsequent layers are formed even though it faces upward to the radiation source (e.g., the sun) when the cadmium telluride thin film photovoltaic device 10 is in used. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmissiveness of about 0.9 or greater in the spectrum of interest (e.g., wavelengths from about 300 nm to about 900 nm).

A transparent conductive oxide (TCO) layer 14 is shown on the glass 12 of the exemplary device 10 of FIG. 1. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering (e.g., DC sputtering or RF sputtering) on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 µm and about 1 µm, for example from about 0.1 µm to about 0.5 µm, such as from about 0.25 µm to about 0.35 µm. Suitable flat glass substrates having a TCO layer 14 formed on the superstrate surface can be purchased commercially from various glass manufactures and suppliers. For example, a particularly suitable glass 12 including a TCO layer 14 includes a glass commercially available under the name TEC 15 TCO from Pilkington North America Inc. (Toledo, Ohio), which includes a TCO layer having a sheet resistance of 15 ohms per square.

The resistive transparent layer 16 described above is shown on the TCO layer 14 of the exemplary cadmium telluride thin film photovoltaic device 10 of FIG. 1.

A cadmium sulfide layer 18 is shown on resistive transparent layer 16 of the exemplary device 10 of FIG. 1. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering (e.g., direct current (DC) sputtering or radio frequency (RF) sputtering) on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 μm, such as between about 10 nm and about 100 nm, such as from about 50 nm to about 80 nm, with a minimal presence of pinholes between the resistive transparent layer 16 and the cadmium sulfide layer 18. Additionally, a cadmium sulfide layer 18 having a thickness less than about 0.1 μm reduces any absorption of radiation energy by the cadmium sulfide layer 18, effectively increasing the amount of radiation energy reaching the underlying cadmium telluride layer 22.

A cadmium telluride layer 20 is shown on the cadmium sulfide layer 18 in the exemplary cadmium telluride thin film photovoltaic device 10 of FIG. 1. The cadmium telluride layer 20 is a p-type layer that generally includes cadmium telluride (CdS) but may also include other materials. As the p-type layer of device 10, the cadmium telluride layer 20 is the photovoltaic layer that interacts with the cadmium sulfide layer 18 (i.e., the n-type layer) to produce current from the absorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create electron-hole pairs upon absorption of the radiation energy. Holes may travel from the p-type side (i.e., the cadmium telluride layer 20) across the junction to the n-type side (i.e., the cadmium sulfide layer 18) and, conversely, electrons may pass from the n-type side to the p-type side. Thus, the p-n junction formed between the cadmium sulfide layer 18 and the cadmium telluride layer 20 forms a diode-like material that allows conventional current to flow in only one direction to create a charge imbalance across the boundary. This charge imbalance leads to the creation of an electric field spanning the p-n junction and separating the freed electrons and holes.

The cadmium telluride layer 20 can be formed by any known process, such as chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 μm and about 10 μm, such as from about 1 μm and about 5 μm. In one particular embodiment, the cadmium telluride layer 20 can have a thickness between about 2 μm and about 4 μm, such as about 3 μm.

A series of post-forming treatments can be applied to the exposed surface of the cadmium telluride layer 20. These treatments can tailor the functionality of the cadmium telluride layer 20 and prepare its surface for subsequent adhesion to the back contact layer(s) 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride and then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing cadmium oxide from the surface. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 24.

Copper can be applied to the exposed surface of the cadmium telluride layer 20 by any process. For example, copper can be sprayed or washed on the surface of the cadmium telluride layer 20 in a solution with a suitable solvent (e.g., methanol, water, acetate, or the like, or combinations thereof) followed by annealing. In particular embodiments, the copper may be supplied in the solution in the form of copper chloride. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

A back contact layer 22 is shown on the cadmium telluride layer 20. The back contact layer 22 generally serves as the back electrical contact, in relation to the opposite, TCO layer 14 serving as the front electrical contact. The back contact layer 22 can be formed on, and in one embodiment is in direct contact with, the cadmium telluride layer 20. The back contact layer 22 is suitably made from one or more highly conductive materials, such as elemental nickel, chromium, copper, tin, aluminum, gold, silver, technetium or alloys or mixtures thereof. Additionally, the back contact layer 22 can be a single layer or can be a plurality of layers. In one particular embodiment, the back contact layer 22 can include graphite, such as a layer of carbon deposited on the p-layer followed by one or more layers of metal, such as the metals described above. The back contact layer 22, if made of or comprising one or inure metals, is suitably applied by a technique such as sputtering or metal evaporation. If it is made from a graphite and polymer blend, or from a carbon paste, the blend or paste is applied to the semiconductor device by any suitable method for spreading the blend or paste, such as screen printing, spraying or by a "doctor" blade. After the application of the graphite blend or carbon paste, the device can be heated to convert the blend or paste into the conductive back contact layer. A carbon layer, if used, can be from about 0.1 μm to about 10 μm in thickness, for example from about 1 μm to about 5 μm. A metal layer of the back contact, if used for or as part of the back contact layer 22, can be from about 0.1 μm to about 1 μm in thickness.

The encapsulating glass 24 is also shown in the exemplary cadmium telluride thin film photovoltaic device 10 of FIG. 1.

Other components (not shown) can be included in the exemplary device 10, such as bus bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electric. A convenient means for achieving such series connections is to laser scribe the device to divide the device into a series of cells connected by interconnects. In one particular embodiment, for instance, a laser can be used to scribe the deposited layers of the semiconductor device to divide the device into a plurality of series connected cells.

Figure 2:
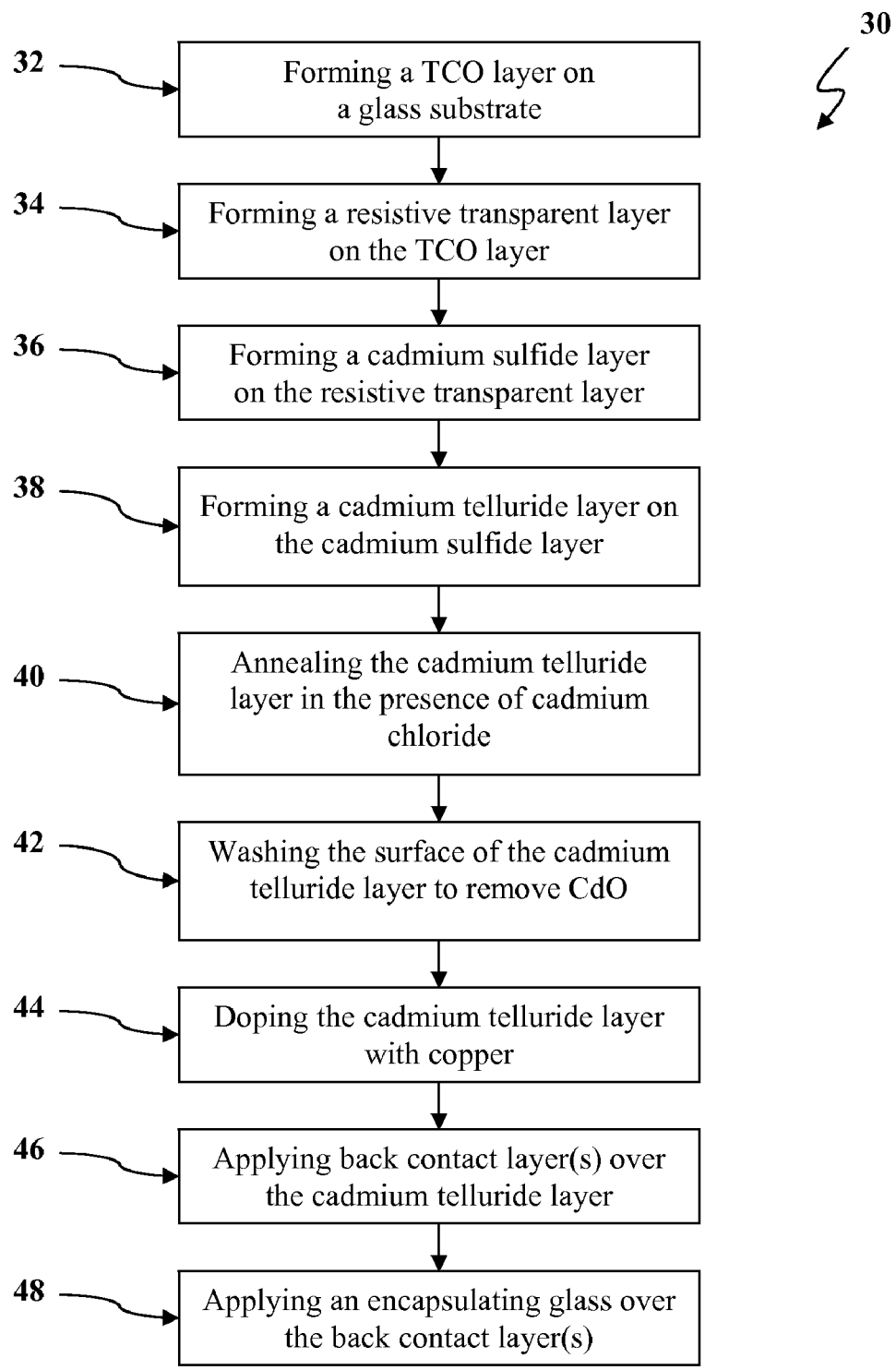
FIG. 2 shows a flow diagram of an exemplary method of manufacturing a photovoltaic module including a cadmium telluride thin film photovoltaic device; and, FIG. 3 shows a general schematic of a cross-sectional view of an exemplary DC sputtering chamber according to one embodiment of the present invention.

FIG. 2 shows a flow diagram of an exemplary method 30 of manufacturing a photovoltaic device according to one embodiment of the present invention. According to the exemplary method 30, a TCO layer is formed on a glass substrate at 32. At 34, a resistive transparent layer is formed on the TCO layer. A cadmium sulfide layer is formed on the resistive transparent layer at 36, and a cadmium telluride layer is formed on the cadmium sulfide layer at 38. The cadmium telluride layer can be annealed in the presence of cadmium chloride at 40, and washed to remove any CdO formed on the surface at 42. The cadmium telluride layer can be doped with copper at 44. At 46, back contact layer(s) can be applied over the cadmium telluride layer, and an encapsulating glass can be applied over the back contact layer at 50.

One of ordinary skill in the art should recognize that other processing and/or treatments can be included in the method 30. For instance, the method may also include laser scribing to form electrically isolated photovoltaic cells in the device. These electrically isolated photovoltaic cells can then be connected in series to form a photovoltaic module. Also, electrical wires can be connected to positive and negative terminals of the photovoltaic module to provide lead wires to harness electrical current produced by the photovoltaic module.

Figure 3:
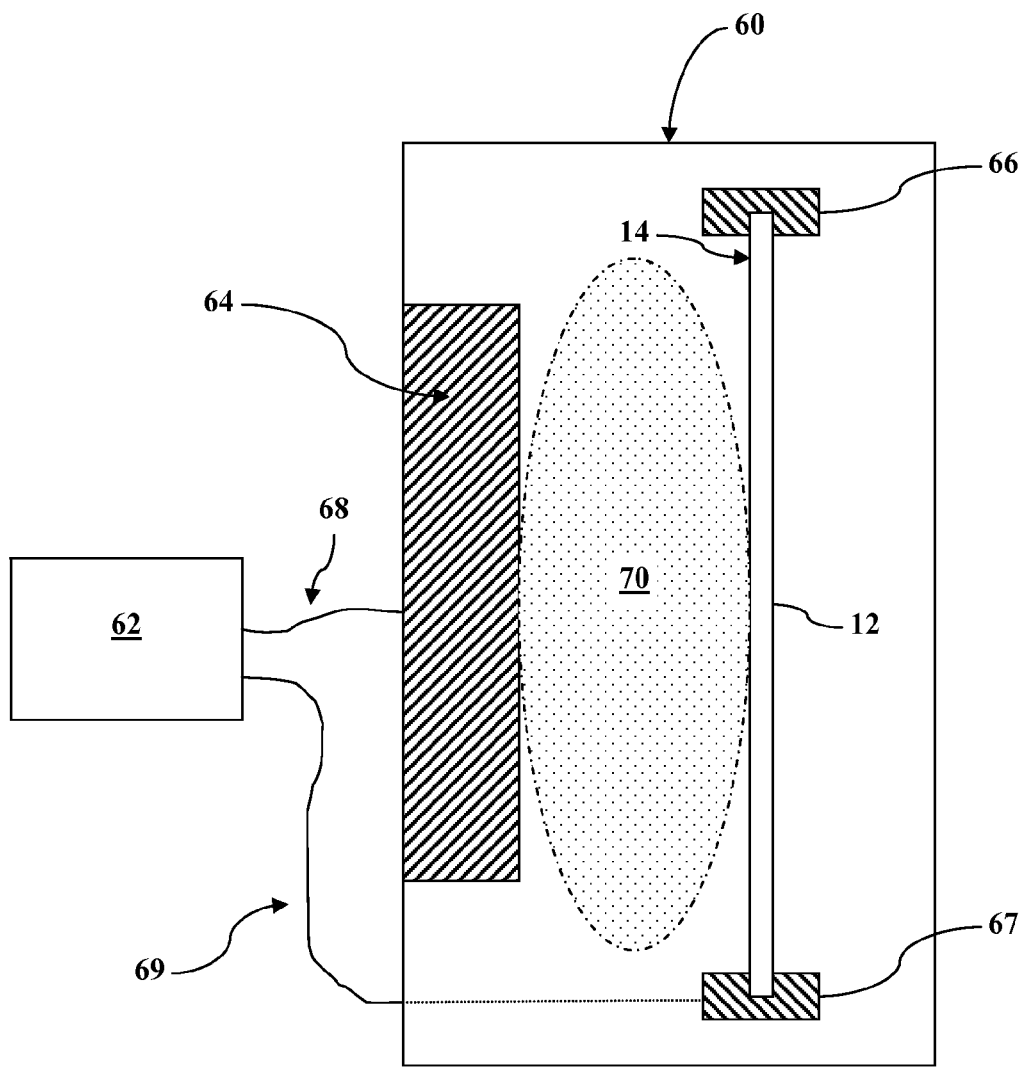

FIG. 3 shows a general schematic as a cross-sectional view of an exemplary DC sputtering chamber 60 according to one embodiment of the present invention. A DC power source 62 is configured to control and supply DC power to the chamber 60. As shown, the DC power source applies a voltage to the cathode 64 to create a voltage potential between the cathode 64 and an anode formed by the glass substrate 12 held between top support 66 and bottom support 67 via wires 68 and 69, respectively. Generally, the glass substrate is positioned within the sputtering chamber 60 such that the TCO layer 14 is facing the cathode 64 in order to form the sputtered layer on the TCO layer 14.

A plasma field 70 is created once the sputtering atmosphere is ignited, and is sustained in response to the voltage potential between the cathode 64 and the glass substrate 12 acting as an anode. The voltage potential causes the plasma ions within the plasma field 70 to accelerate toward the cathode 64, causing atoms from the cathode 64 to be ejected toward the TCO layer 14 on the glass substrate 12. As such, the cathode 64 can be referred to as a "target" and acts as the source material for the formation of the resistive transparent layer 16 on the TCO layer 14. The cathode 64 can be a metal alloy target, such as elemental tin, elemental zinc, or mixtures thereof. Additionally, in some embodiments, a plurality of cathodes 64 can be utilized. A plurality of cathodes 64 can be particularly useful to form a layer including several types of materials (e.g., co-sputtering). Since the sputtering atmosphere contains oxygen gas, oxygen particles of the plasma field 70 can react with the ejected target atoms to form an oxide layer on the TCO layer 14 on the glass substrate 12.

Although only a single DC power source 62 is shown, the voltage potential can be realized through the use of multiple power sources coupled together. Additionally, the exemplary sputtering chamber 60 is shown having a vertical orientation, although any other configuration can be utilized.

Examples

Experimental cadmium telluride thin film photovoltaic devices were manufactured. In each of these experimental devices, the method shown in FIG. 2 was generally followed.

Specifically, a tin oxide coated glass was purchased commercially under the name TEC 15 TCO from Pilkington North America Inc. (Toledo, Ohio) and used as a superstrate. A resistive transparent layer was via DC sputtering using metal targets of tin and varying concentrations of zinc. Sample 1 had a metal target of tin and 1% by weight zinc; sample 2 had a metal target of tin and 5% by weight zinc; and sample 3 had a metal target of tin and 22.5% by weight zinc. The remaining process was identical for each of the samples. A CdS layer was sputtered onto the superstrate to a thickness of 70 nm. A CdTe layer was formed via close space sublimation to a thickness of 3 μm. A solution of $CdCl_2$ in methanol was sprayed on the CdTe layer followed by annealing for 20 minutes at 395° C. The CdTe layer was then etched with ethylenediamine (DAE) at a 50% concentration for 1 minute. A solution of copper acetate in methanol was sprayed onto the CdTe layer, followed by heating for 12 minutes at 170° C. A back contact layer was formed by screen printing a graphite paste, baking at 130° C. for 8 minutes, and then sputtering a NiV/Al/NiV metal stack onto the graphic layer. Each of the samples was prepared into 12-cell modules.

Table 1 below shows the results achieved for Samples 1, 2, and 3.

TABLE 1

| Sample | Conc. of zinc in target (% by weight) | Conc. of zinc oxide in RT layer (% by mole fraction) | Efficiency | VOC (mV) | Jsc (mA/cm$^2$) | FF (%) |
|---|---|---|---|---|---|---|
| 1 | 1 | 1.8 | 9 | 766 | 18.9 | 62 |
| 2 | 5 | 8.7 | 9.9 | 806 | 19.4 | 64 |
| 3 | 22.5 | 33.33 | 9.3 | 796 | 18.3 | 64 |

These results show that Sample 2 achieved an acceptably stable device having improved efficiency, higher open-circuit voltage ("Voc"), and higher photocurrent density ("Jsc").

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A cadmium telluride thin film photovoltaic device, comprising:
   a glass superstrate;
   a transparent conductive oxide layer on the glass superstrate;
   a resistive transparent layer on the transparent conductive oxide layer, wherein the resistive transparent layer comprises $Zn_xSn_{1-x}O_{2-x}$, where $0.05<x<0.33$;
   a cadmium sulfide layer on the resistive transparent layer;
   a cadmium telluride layer on the cadmium sulfide layer; and,
   a back contact on the cadmium telluride layer.

2. The cadmium telluride thin film photovoltaic device as in claim 1, wherein the resistive transparent layer comprises $Zn_xSn_{1-x}O_{2-x}$, where $0.1<x<0.2$.

3. The cadmium telluride thin film photovoltaic device as in claim 1, wherein the resistive transparent layer consists of $Zn_xSn_{1-x}O_{2-x}$, where $0.05<x<0.33$.

4. A method for manufacturing a cadmium telluride based thin film photovoltaic device, the method comprising:
   sputtering a resistive transparent layer on a transparent conductive oxide layer from an alloy target, wherein the alloy target comprises zinc and tin, and wherein the resistive transparent layer comprises $Zn_xSn_{1-x}O_{2-x}$, where $0.05<x<0.33$;
   forming a cadmium sulfide layer on the resistive transparent layer;
   forming a cadmium telluride layer on the cadmium sulfide layer; and,
   forming a back contact layer on the cadmium telluride layer.

5. The method as in claim 4, wherein the alloy target comprises elemental zinc from about 5% by weight to about 20% by weight.

6. The method as in claim 4, wherein the alloy target comprises elemental zinc from about 10% by weight to about 20% by weight.

7. The method as in claim 4, wherein the resistive transparent layer is sputtered at a temperature between about 15° C. and about 100° C.

8. The method as in claim 4, wherein the resistive transparent layer is sputtered at a temperature between about 100° C. and about 300° C.

9. The method as in claim 4, wherein the resistive transparent layer is DC sputtered from the alloy target in an oxygen atmosphere, wherein the alloy target is a metal alloy target comprising elemental zinc from about 3% by weight to about 22% by weight and elemental tin.

10. The method as in claim 9, wherein the metal alloy target consists of elemental zinc from about 5% by weight to about 20% by weight and elemental tin.

11. The method as in claim 9, wherein the metal alloy target consists of elemental zinc from about 10% by weight to about 20% by weight and elemental tin.

12. The method as in claim 9, wherein the oxygen atmosphere comprises about 99% oxygen or greater.

13. The method as in claim 9, wherein the oxygen atmosphere has a pressure between about 1 mTorr and about 20 mTorr.

14. The method as in claim 9, wherein the oxygen atmosphere has a pressure between about 5 mTorr and about 10 mTorr.

15. The method as in claim 4, wherein the resistive transparent layer is RF sputtered from the alloy target, wherein the alloy target is a ceramic alloy target comprising zinc oxide and tin oxide with the zinc oxide having a mole fraction between about 5% and about 33%.

16. The method as in claim 15, wherein the ceramic alloy target comprises zinc oxide and tin oxide with the zinc oxide having a mole fraction between about 5% and about 20%.

17. The method as in claim 15, wherein the ceramic alloy target consists of zinc oxide and tin oxide with the zinc oxide having a mole fraction between about 10% and about 20%.

18. The method as in claim 4, wherein the resistive transparent layer has a thickness between about 0.01 μm and about 1 μm.

19. The method as in claim 4, wherein the resistive transparent layer has a thickness between about 0.1 μm to about 0.5 μm.

* * * * *